(12) United States Patent
Hyun et al.

(10) Patent No.: US 12,446,147 B2
(45) Date of Patent: Oct. 14, 2025

(54) DISPLAY DEVICE

(71) Applicant: Samsung Display Co., LTD., Yongin-si (KR)

(72) Inventors: Chang Ho Hyun, Seoul (KR); Hyoungsik Moon, Hwaseong-si (KR); Yong Doo Park, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 331 days.

(21) Appl. No.: 18/093,726

(22) Filed: Jan. 5, 2023

(65) Prior Publication Data

US 2023/0320011 A1 Oct. 5, 2023

(30) Foreign Application Priority Data

Mar. 14, 2022 (KR) .................. 10-2022-0031597

(51) Int. Cl.
*H05K 1/02* (2006.01)
*G02F 1/1333* (2006.01)
*H05K 9/00* (2006.01)

(52) U.S. Cl.
CPC ......... *H05K 1/0259* (2013.01); *H05K 9/0024* (2013.01); *G02F 1/133334* (2021.01); *H05K 9/0022* (2013.01); *H05K 9/0067* (2013.01); *H05K 2201/10128* (2013.01)

(58) Field of Classification Search
CPC .... H05K 9/0022; H05K 9/0024; H05K 9/009; H05K 9/0067; H05K 9/0054; H05K 1/0259; H05K 1/118; G02F 1/133334
See application file for complete search history.

(56) References Cited

U.S. PATENT DOCUMENTS

| | | | | |
|---|---|---|---|---|
| 8,416,162 B2* | 4/2013 | Lee | ............... | G02F 1/13452 345/82 |
| 8,665,393 B2* | 3/2014 | Lee | ............... | G02F 1/13452 349/149 |
| 11,644,704 B2* | 5/2023 | Wang | ............... | G02F 1/133382 349/56 |
| 2009/0284946 A1* | 11/2009 | Yang | ............... | H05K 9/0054 361/818 |
| 2009/0310057 A1* | 12/2009 | Kang | ............... | G02F 1/13452 349/58 |
| 2011/0267573 A1* | 11/2011 | Lee | ............... | H05K 9/0096 349/150 |
| 2012/0099281 A1* | 4/2012 | Kim | ............... | G02F 1/13452 361/720 |

FOREIGN PATENT DOCUMENTS

| | | |
|---|---|---|
| JP | 4349009 | 7/2009 |
| KR | 101340296 | 12/2013 |
| KR | 1020180079554 | 7/2018 |
| KR | 1020200047811 | 5/2020 |

* cited by examiner

*Primary Examiner* — Nidhi Thaker
(74) *Attorney, Agent, or Firm* — CANTOR COLBURN LLP

(57) ABSTRACT

A display device includes a display panel, a driving integrated circuit chip disposed on a front surface of the display panel, and a cover disposed to cover the driving integrated circuit chip. The cover includes a first portion covering the driving integrated circuit chip, a second portion disposed on a rear surface of the display panel, and a bending portion disposed between the first portion and the second portion and surrounding an edge of the display panel.

16 Claims, 19 Drawing Sheets

DISPLAY DEVICE

This application claims priority to Korean Patent Application No. 10-2022-0031597, filed on Mar. 14, 2022, and all the benefits accruing therefrom under 35 U.S.C. § 119, the content of which in its entirety is herein incorporated by reference.

BACKGROUND

(a) Field

This disclosure relates to a display device, and more particularly, to a display device including a cover capable of protecting a driving unit from an electro-static discharge (ESD).

(b) Description of the Related Art

A display device, such as an emissive display device that displays an image by controlling luminance of light-emitting devices and a liquid crystal display that displays an image by controlling transmittance of a liquid crystal layer are widely used in various fields. An emissive display device may include light emitting diodes corresponding to pixels, and may display an image by controlling luminance of each of the light emitting diodes. Unlike a light-receiving type of display device such as a liquid crystal display, the emissive display device may not use a separate light source to reduce thickness and weight thereof. In addition, the emissive display device has characteristics such as high luminance, high contrast ratio, high color reproduction, high response speed, and the like, to display a high quality image.

Due to such desirable characteristics, the emissive display device is applied to various electronic devices including mobile devices such as smart phones and tablets, monitors, televisions, and the like, and has been in the spotlight as a display device for vehicles.

SUMMARY

A display device such as an emissive display device or a liquid crystal display includes a driving unit, which may be damaged when the driving unit is exposed to high voltage static electricity. Embodiments provide a display device that can be protected from static electricity.

A display device according to an embodiment includes: a display panel; a driving integrated circuit chip disposed on a front surface of the display panel; and a cover disposed to cover the driving integrated circuit chip. In such an embodiment, the cover includes a first portion covering the driving integrated circuit chip, a second portion disposed on a rear surface of the display panel, and a bending portion disposed between the first portion and the second portion and surrounding an edge of the display panel.

In an embodiment, each of the first portion and the second portion may have a first width, and the bending portion may have a second width which is smaller than the first width.

In an embodiment, a notch may be defined at the edge of the display panel, and the bending portion may be disposed in the notch.

In an embodiment, the notch may be defined at opposite edges of the display panel. In such an embodiment, the cover may further include a third portion disposed on the rear surface of the display panel, and a bending portion disposed between the first portion and the third portion and in the notch.

In an embodiment, each of the first portion, the second portion, and the third portion may have a first width, and the bending portion may have a second width which is smaller than the first width.

In an embodiment, the first portion, the second portion, the third portion, and the bending portion may have a same width as each other.

In an embodiment, the notch may be defined at opposite edges of the display panel in a first direction, and the notch and the driving integrated circuit chip may be aligned in the first direction.

In an embodiment, the display device may further include a printed circuit board bonded to a lower end portion of the display panel, where the circuit board may be bent while surrounding an edge of the lower end portion of the display panel.

In an embodiment, the second portion may be electrically connected to the printed circuit board.

In an embodiment, a bent portion of the printed circuit board may protrude from a lower end of the display panel in a second direction crossing the first direction, and the cover may not protrude from a side end of the display panel in the second direction.

A display device according to an embodiment includes: a display panel including a first edge extending in a first direction and a second edge extending in a second direction intersecting the first direction; a driving integrated circuit chip disposed on a front surface of the display panel; a printed circuit board connected to the front surface of the display panel and bent toward a rear surface of the display panel while surrounding the first edge; and a cover disposed to cover the driving integrated circuit chip on the front surface of the display panel and to be bent while surrounding the second edge to be connected to the printed circuit board on the rear surface of the display panel.

In an embodiment, the cover may include a first portion covering the driving integrated circuit chip, a second portion and a third portion, which are connected to the printed circuit board, and a bending portion disposed between the first portion and the second portion and between the first portion and the third portion and surrounding the second edge.

In an embodiment, the first portion may be disposed on the front surface of the display panel, and the second portion and the third portion may be disposed on the rear surface of the display panel.

In an embodiment, each of the first portion, the second portion, and the third portion may have a first width, and the bending portion may have a second width which is smaller than the first width.

In an embodiment, a notch may be defined at the second edge of the display panel, and the bending portion may be disposed in the notch.

In an embodiment, the first portion, the second portion, the third portion, and the bending portion may have a same width as each other.

In an embodiment, the second portion or the third portion may be grounded to a ground portion disposed on the printed circuit board.

In an embodiment, the cover may be in the form of a tape including a metal fabric, a metal mesh, or a metal foil.

In an embodiment, the printed circuit board may protrude from the first edge in the second direction.

In an embodiment, the cover may not protrude from the first edge in the second direction.

According to embodiments, as described herein, a driving unit such as a driving integrated circuit chip may be protected from static electricity without increasing a size or dead space of a display device.

DETAILED DESCRIPTION

Figure 1:
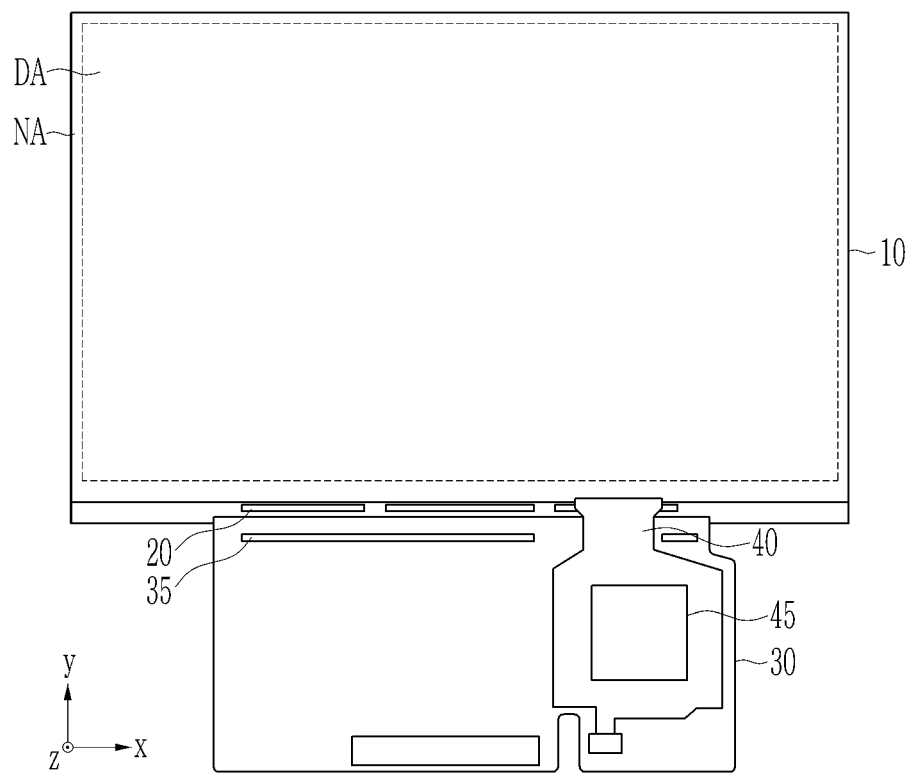
FIG. 1 illustrates a schematic front view showing a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, film, area, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the drawings, signs "x", "y", and "z" are used to indicate directions, where x is used for indicating a first direction, y is used for indicating a second direction that is perpendicular to the first direction, and z is used for indicating a third direction that is perpendicular to the first direction and the second direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
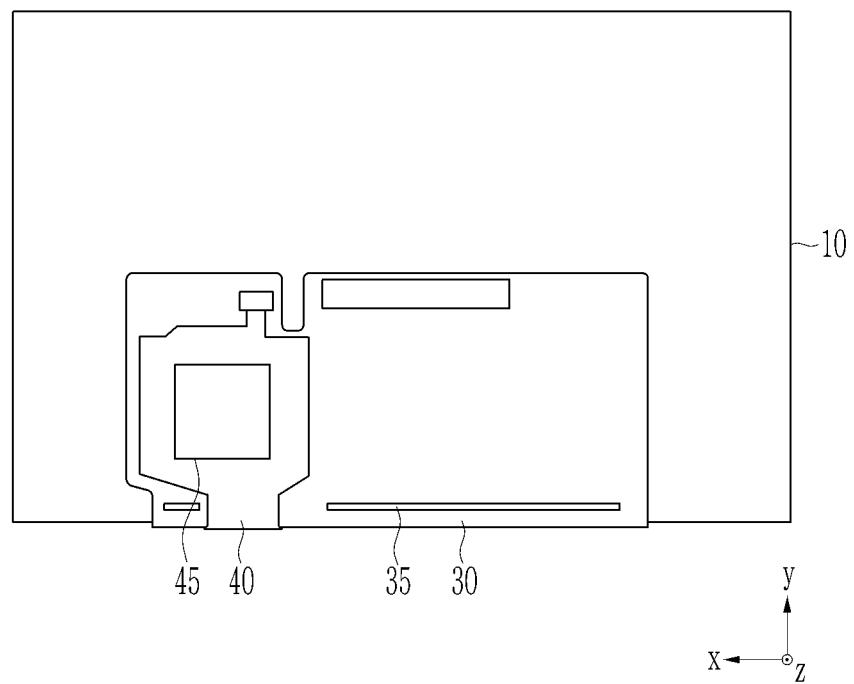
FIG. 2 illustrates a schematic rear view showing a display device according to an embodiment.

FIG. 1 illustrates a schematic front view showing a display device according to an embodiment, and FIG. 2 illustrates a schematic rear view showing a display device according to an embodiment.

Referring to FIG. 1 and FIG. 2, an embodiment of the display device may include a display panel 10, a driving unit including a driving integrated circuit chip 20, a first printed circuit board 30 (or a printed circuit board for display), a printed circuit board 40 (or a printed circuit board for touch), and the like. FIG. 1 illustrates an embodiment of the display device in a state before bending the first printed circuit board 30 and the second printed circuit board 40, and FIG. 2 illustrates an embodiment of the display device in a state after bending the first printed circuit board 30 and the second printed circuit board 40.

The display panel 10 may be a light emitting display panel including light emitting diodes or a liquid crystal display panel including a liquid crystal layer, but is not limited thereto. The display panel 10 may include a display area DA corresponding to a screen on which an image is displayed and a non-display area NA, and circuits and/or signal lines for generating and/or transferring various signals and voltages applied to the display area DA are disposed in the non-display area NA. The non-display area NDA may be positioned to surround a periphery of the display area DA. In FIG. 1, inside and outside of a dotted rectangle correspond to the display area DA and the non-display area NA, respectively.

Pixels are positioned to have a matrix form in the display area DA of the display panel 10. In addition, signal lines such as a gate line and a driving voltage line may be positioned in the display area DA. Each of the pixels may be connected to a corresponding gate line, a corresponding data line, a corresponding driving voltage line, and the like to receive a gate signal, a data voltage, a driving voltage, and the like therefrom. The pixel may be implemented as a light-emitting device such as a light emitting diode.

A touch electrode for detecting a contact touch and/or a non-contact touch of a user may be positioned in the display area DA. Accordingly, the display panel 10 may be a touch screen panel capable of sensing a touch in addition to having a function of displaying an image. Although an embodiment where the display area DA has a substantially rectangular shape is illustrated, the display area DA may have various shapes such as a polygonal shape, a circular shape, an elliptical shape, and the like.

A driving unit may be disposed in the non-display area NA of the display panel 10 to generate and/or process various signals for driving the display panel 10. The driving unit may include a data driver for applying a data voltage to the data line, a gate driver for applying a gate signal to the gate line, and a signal controller for controlling the data driver and the gate driver. The pixels may receive the data voltage at predetermined timing based on the gate signal generated by the gate driver. The gate driver may be integrated in the display panel 10, and may be positioned on at least one side of the display area DA (e.g., left and right sides of the display area DA).

The data driver may be provided as or defined by the driving integrated circuit chip 20. The driving integrated circuit chip 20 may be mounted in the non-display area NA at a lower end portion of the display panel 10. The driving integrated circuit chip 20 may have a three-dimensional shape of an approximately cuboid shape and an approximately rectangular planar shape. The driving integrated circuit chip 20 may be mounted with a long side that is parallel to the first direction x. The data driver may be provided as a single driving integrated circuit chip 20 or a plurality of driving integrated circuit chips 20 depending on a size of the display panel 10. The driving integrated circuit chips 20 may be mounted to be aligned in the first direction x, e.g., may be positioned on a same line in the first direction x.

A signal controller may be provided as an integrated circuit chip and may be mounted in the first printed circuit board 30 or the like to be electrically connected to the display panel 10. In an embodiment, for example, the signal controller may be integrated into the driving integrated circuit chip 20.

A first pad portion (not illustrated) in which pads for receiving signals from the outside of the display panel 10 are arranged may be positioned in the non-display area NA of the display panel 10. The first pad portion may be positioned at a lower portion of the display panel 10. The driving integrated circuit chip 20 may be positioned between the display area DA and the first pad portion in a second direction y. The first printed circuit board 30 may be bonded to the first pad portion. Pads of the first printed circuit board 30 may be electrically connected to the pads of the first pad portion. At least a portion of the first printed circuit board 30 may be flexible.

A second pad portion (not illustrated) in which pads for receiving signals for driving touch electrodes and outputting signals from the touch electrodes are arranged may be positioned in the non-display area NA of the display panel 10. The second pad portion may be positioned between the display area DA and the driving integrated circuit chip 20 in the second direction y. The second printed circuit board 40 may be bonded to the second pad portion. Pads of the second printed circuit board 40 may be electrically connected to the pads of the second pad portion. A touch driver 45 may be positioned in the second printed circuit board 40. The touch driver 45 may be provided as an integrated circuit chip. At least a portion of the second printed circuit board 40 may be flexible. The second printed circuit board 40 may be connected to the first printed circuit board 30 through a zero insertion force (ZIF) connector or the like.

The first printed circuit board 30 and the second printed circuit board 40 may be bent while surrounding a lower edge (or a lower side surface) of the display panel 10 that is substantially parallel to the first direction x in a state where ends or edges thereof are respectively bonded to the first pad portion and the second pad portion. Accordingly, as illustrated in FIG. 2, most of the first printed circuit board 30 and the second printed circuit board 40 may be positioned on a rear surface of the display panel 10, a portion protruding from the display panel 10 may be minimized, and a size of the display device may be reduced. The first printed circuit board 30 may be attached to the rear surface of the display panel 10 through an adhesive member to maintain a state in which the first printed circuit board 30 and the second printed circuit board 40 are bent. The first printed circuit board 30 may include at least one ground portions 35. In a state in which the first printed circuit board 30 is bent, the ground portion 35 may be positioned on the rear surface of the display panel 10, and may be positioned adjacent to an edge of the display panel 10. The ground portion 35 may be formed to extend in the first direction x. A ground voltage may be applied to the ground portion 35.

Figure 3:
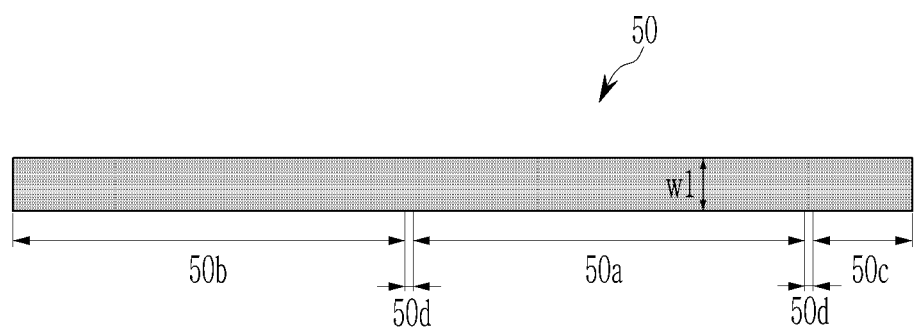
FIG. 3 illustrates a schematic view showing a cover according to an embodiment.
Figure 4:
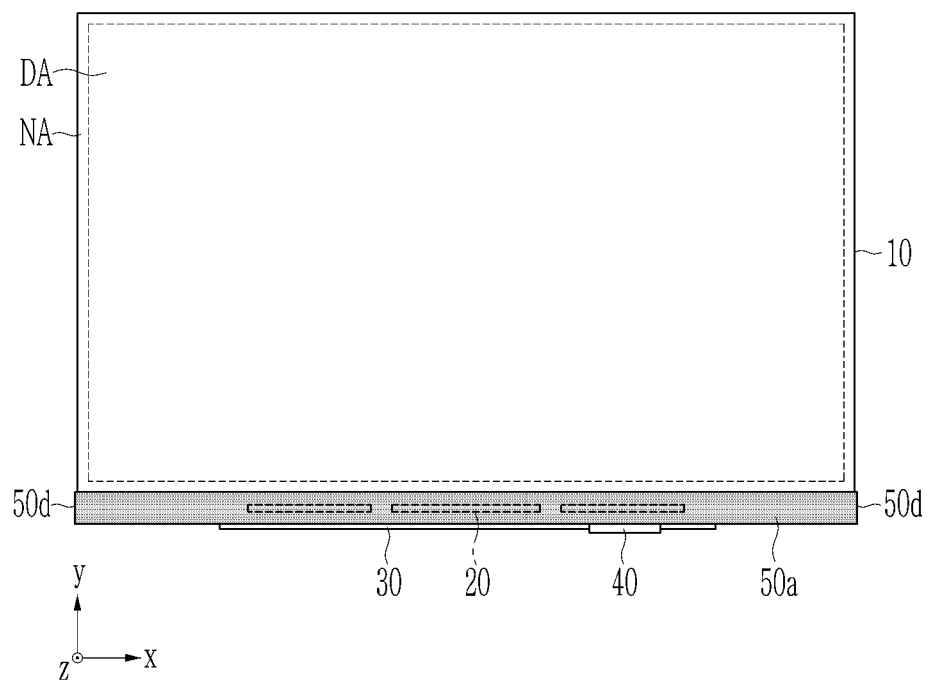
FIG. 4 illustrates a schematic front view showing a display device to which a cover is applied according to an embodiment.
Figure 5:
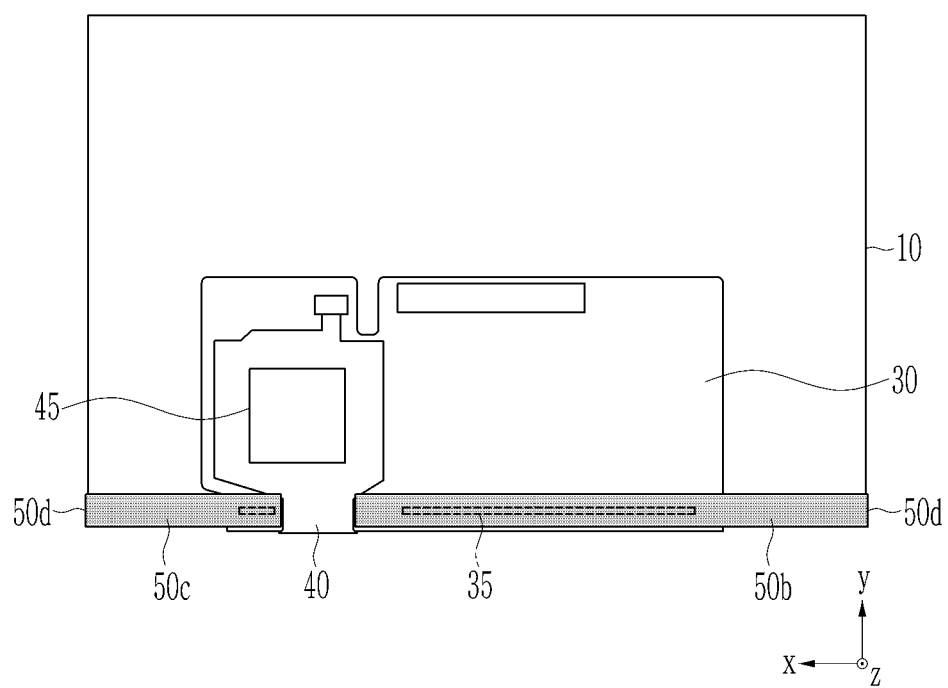
FIG. 5 illustrates a schematic rear view showing a display device to which a cover is applied according to an embodiment.

FIG. 3 illustrates a schematic view showing a cover according to an embodiment, FIG. 4 illustrates a schematic front view showing a display device to which a cover is applied according to an embodiment, and FIG. 5 illustrates a schematic rear view showing a display device to which a cover is applied according to an embodiment.

Referring to FIG. 3, the cover 50 is provided to cover the driving integrated circuit chip 20 to protect the driving integrated circuit chip 20 from static electricity. The cover 50 may include or be made of a flexible material capable of shielding static electricity. In an embodiment, for example, the cover 50 may include or be formed of a metal fabric, a metal mesh, a metal foil, etc., and may be in the form of a tape. The cover 50 may have a thickness of about 200 micrometers (μm) or less or about 100 μm or less, e.g., about 10 μm to about 50 μm. An adhesive member may be positioned on one surface of the cover 50. In an embodiment, for example, an adhesive may be provided or applied to one surface of the cover 50 or a double-sided tape may be attached thereto. The adhesive member may be entirely or partially positioned on one surface of the cover 50.

The cover 50 may include a first portion 50a, a second portion 50b, a third portion 50c, and a bending portion 50d. The bending portion 50d may be positioned between the first portion 50a and the second portion 50b and between the first portion 50a and the third portion 50c. The cover 50a may have a constant width as a whole. In an embodiment, for example, the first portion 50a, the second portion 50b, and the third portion 50c, the bending portion 50d of the cover 50 may all have a same width w1.

Referring to FIG. 4 and FIG. 5, in an embodiment, the cover 50 may be attached to the display panel 10 to cover the driving integrated circuit chip 20 from a front of the display panel 10. In such an embodiment, the cover 50 may be bent while surrounding opposite edges (or side surfaces) of the display panel 10 substantially parallel to the second direction y and attached to the display panel 10 and the first printed circuit board 30. In such an embodiment, the first portion 50a of the cover 50 may be attached to the front surface of the display panel 10 while covering the driving integrated circuit chip 20. The bending portion 50d of the cover 50 may be bent while surrounding the opposite edges of the display panel 10, and the second portion 50b and the third portion 50c of the cover 50 may be attached to the rear surface of the display panel 10 and the first printed circuit board 30. The bending portion 50d may contact an edge of the display panel 10. The bending portion 50d may be attached to an edge of the display panel 10. The bending portion 50d may protrude toward a side of the display panel 10 by approximately a thickness of the bending portion 50d. Then, the bending portion 50d may not protrude from the opposite sides of the display panel 10. The second portion 50b and/or the third portion 50c may be electrically connected to the first printed circuit board 30. In an embodiment, for example, the second portion 50b and the third portion 50c may be connected to the ground portion 35 positioned on the first printed circuit board 30 to be grounded. A ground voltage may be applied to the ground portion 35 of the first printed circuit board 30. In such an embodiment, an adhesive member may not be positioned or provided in a way such that the second portion 50b and/or the third portion 50c may contact the ground portion in a region that is connected to the ground portion 35 in the second portion 50b and/or the third portion 50c. Alternatively, an anisotropic conductive layer may be provided or applied to a region in the second portion 50b and/or the third portion 50c corresponding to the ground portion 35, to allow the ground portion 35 to be physically bonded and electrically connected to the second portion 50b and/or the third portion 50c.

In such an embodiment, as the cover 50 is grounded while covering the driving integrated circuit chip 20, static electricity may be effectively prevented from being discharged to the driving integrated circuit chip 20. In such an embodiment, an electro-static discharge (ESD) path may be formed or defined by the cover 50 and the first printed circuit board 30 connected thereto, thereby protecting the driving integrated circuit chip 20 from ESD. In such an embodiment, while the cover 50 is provided to protect the driving integrated circuit chip 20 from ESD, an increase in size of the display device due to the cover 50 may be prevented since the cover 50 does not substantially protrude from the display panel 10. In such an embodiment, the second portion 50b and the third portion 50c of the cover 50 may be connected to the ground portion 35 of the first printed circuit board 30 on a rear surface of the display panel 10 over a large area, and as a grounding area is expanded, an effect of ESD impact may be reduced.

In an embodiment, the second portion 50b and the third portion 50c of the cover 50 are attached to the first printed circuit board 30 on the rear surface of the display panel 10 not to interfere with the second printed circuit board 40. Alternatively, the second portion 50b and/or the third portion 50c may include a region attached to the second printed circuit board 40. In such an embodiment, the first portion 50a of the cover 50 on a front surface of the display panel 10 may cover a portion of the second printed circuit board 40.

Figure 6:
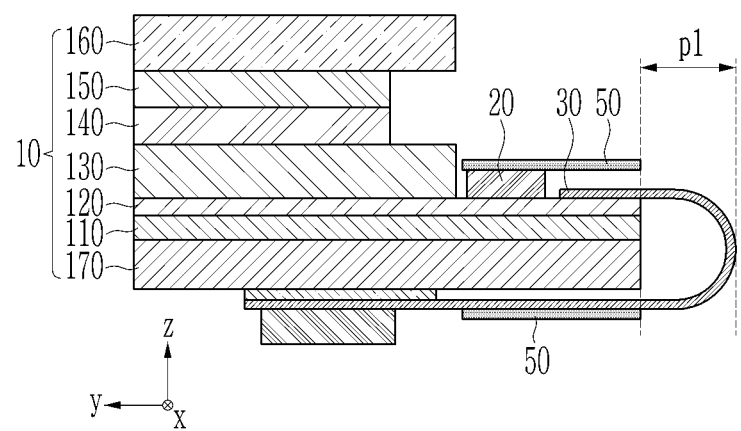
FIG. 6 illustrates a schematic cross-sectional view showing a lower portion in which a cover is positioned in a display device according to an embodiment.
Figure 7:
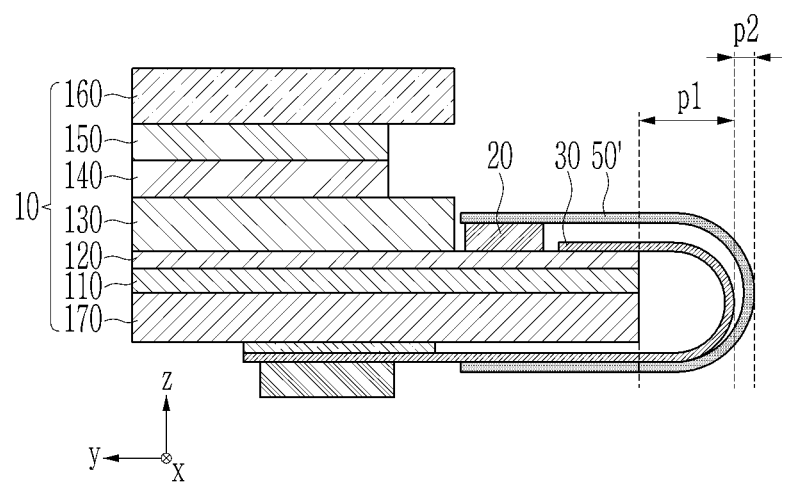
FIG. 7 illustrates a schematic cross-sectional view showing a lower portion in which a cover is positioned in a display device according to a comparative example.

FIG. 6 illustrates a schematic cross-sectional view showing a lower portion in which a cover is positioned in a display device according to an embodiment, and FIG. 7 illustrates a schematic cross-sectional view showing a lower portion in which a cover is positioned in a display device according to a comparative example.

Referring to FIG. 6, in an embodiment, the driving integrated circuit chip 20 may be positioned on a front surface of the display panel 10. The first printed circuit board 30 may be bent while surrounding a lower edge of the display panel 10 in a state where a first end thereof is bonded to a pad portion positioned on the front surface of the display panel 10, and may be attached to a rear surface thereof by an adhesive member such as an adhesive tape. Accordingly, the first printed circuit board 30 may be fixed to the display panel 10, and a bent portion of the first printed circuit board 30 may protrude from a lower end (or a lower side surface) of the display panel 10 by a first protrusion distance p1. Although the first protrusion distance p1 may be reduced by bending the first printed circuit board 30 to be more closely adhere to an edge of the display panel 10, a minimum radius of curvature may be desired to be maintained to prevent the first printed circuit board 30 from being damaged by being bent, and thus there is a limit in reducing the first protrusion distance p1. The cover 50 covering the driving integrated circuit chip 20 may be bent while surrounding a side edge of the display panel 10 to be attached to and connected to the first printed circuit board 30 on the rear surface of the display panel 10. Accordingly, only the first printed circuit board 30 protrudes from the lower end of the display panel 10 by the first protrusion distance p1, and the cover 50 may not protrude in a direction in which the first printed circuit board 30 protrudes from the lower end of the display panel 10 (i.e., in a direction that is opposite to the second direction y).

Referring to FIG. 7, although overall similar to the embodiment of FIG. 6, a conventional cover 50' may be bent while surrounding the lower edge of the display panel 10, to be attached to and connected to the first printed circuit board 30 on the rear surface of the display panel 10. Since the first printed circuit board 30 protrudes from the lower end of the display panel 10, the cover 50' may protrude from a bent portion of the first printed circuit board 30 by a second protrusion distance p2. Accordingly, the conventional cover 50' may increase a size of the display device by the second protrusion distance p2. In an embodiment of the invention, as described above, since the cover 50 does not protrude like the conventional cover 50', the driving integrated circuit chip 20 may be protected from static electricity without increasing the size of the display device. In an embodiment, for example, it was confirmed that there was no abnormality in the driving integrated circuit chip 20 up to ±18 kilovolts (kV) as a result of an ESD impact test. Accordingly, the driving integrated circuit chip 20 may be protected from ESD even when the display device according to the embodiment is used in an environment that is easily exposed to high ESD, such as a vehicle.

In an embodiment, as shown in FIG. 6, the display panel 10 may include a substrate 110, a display layer 120 that may be sequentially disposed on the substrate 110, an encapsulation layer 130, a touch layer 140, an anti-reflection layer 150, and a cover window 160, and may include a functional layer 170 that may be disposed below the substrate 110.

The substrate 110 may be a rigid substrate including glass, quartz, ceramic, or the like. The substrate 110 may be a flexible substrate including a polymer layer including, e.g., a polyimide, a polyamide, or polyethylene terephthalate.

The display layer 120 may include electrical elements for configuring pixels or driving pixels, e.g., transistors, capacitors, light emitting diodes, wires, and the like. The display layer 120 may include insulating layers to insulate or protect electrical elements from each other. In an embodiment, as described above with reference to FIG. 1, the display layer 120 may include a display area DA and a non-display area NA. The first printed circuit board 30 may be electrically connected to the electrical elements of the display layer 120.

The encapsulation layer 130 may seal the display layer 120 to prevent penetration of moisture, oxygen, etc. into the display layer 120. In an embodiment, the encapsulation layer 130 may be provided in the form of a substrate, and may be bonded to the substrate 110 by a sealant. Alternatively, the encapsulation layer 130 may be a thin film encapsulation layer formed on the display layer 120 and including at least one inorganic layer and at least one organic layer. In an embodiment, for example, the thin film encapsulation layer may have a triple layer structure in which an organic layer is positioned between a first inorganic layer and a second inorganic layer.

The touch layer 140 may include touch electrodes. The touch electrodes may sense a user touch by using a mutual capacitance method and/or a self-capacitance method. The touch layer 140 may include insulating layers for insulating or protecting the touch electrodes. The touch layer 140 may be formed on the encapsulation layer 130. In an embodiment, after separately forming the touch layer 140, the touch layer 140 may be attached to the encapsulation layer 130 by an adhesive member such as an optically clear adhesive (OCA). Although not illustrated in FIG. 8, the second printed circuit board 40 may be electrically connected to the touch electrodes.

The anti-reflection layer 150 may reduce light reflected by the touch layer 140 and/or the display layer 120. The anti-reflection layer 150 may include a combination of a polarization layer and a phase delay layer. The anti-reflection layer 150 may include a combination of a light blocking member and color filters, or the anti-reflection layer 150 may include a combination of reflective layers causing destructive interference.

The cover window 160 can transmit an image displayed by the display layer 120 and protect the display panel 10 from an external environment. The cover window 160 may include or be formed of a transparent material such as glass or plastic. The cover window 160 may be attached to the anti-reflection layer 150 by an adhesive member such as an OCA.

A functional layer 170 may be positioned on a rear surface of the substrate 110. The functional layer 170 may include at least one selected from a cushion layer for absorbing external impact, a light absorbing layer for absorbing external light, a heat dissipation layer for dissipating heat, and a shielding layer for shielding electromagnetic waves.

Figure 8A:
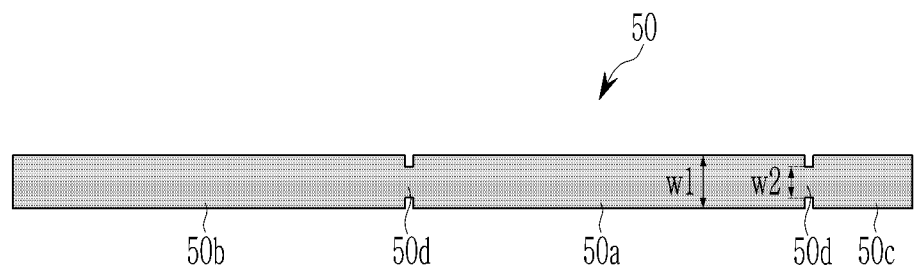
FIG. 8A and FIG. 8B each illustrate a schematic view showing a cover according to an embodiment.
Figure 8B:
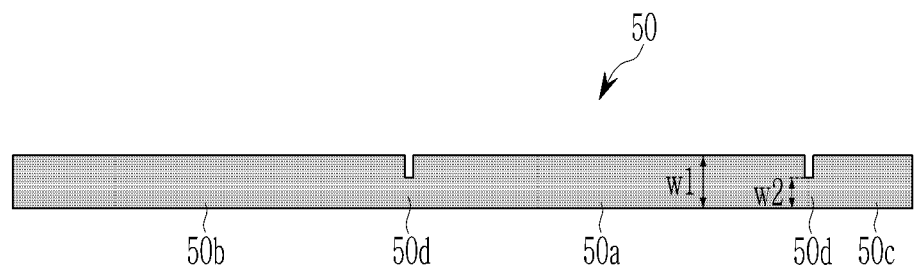
Figure 9:
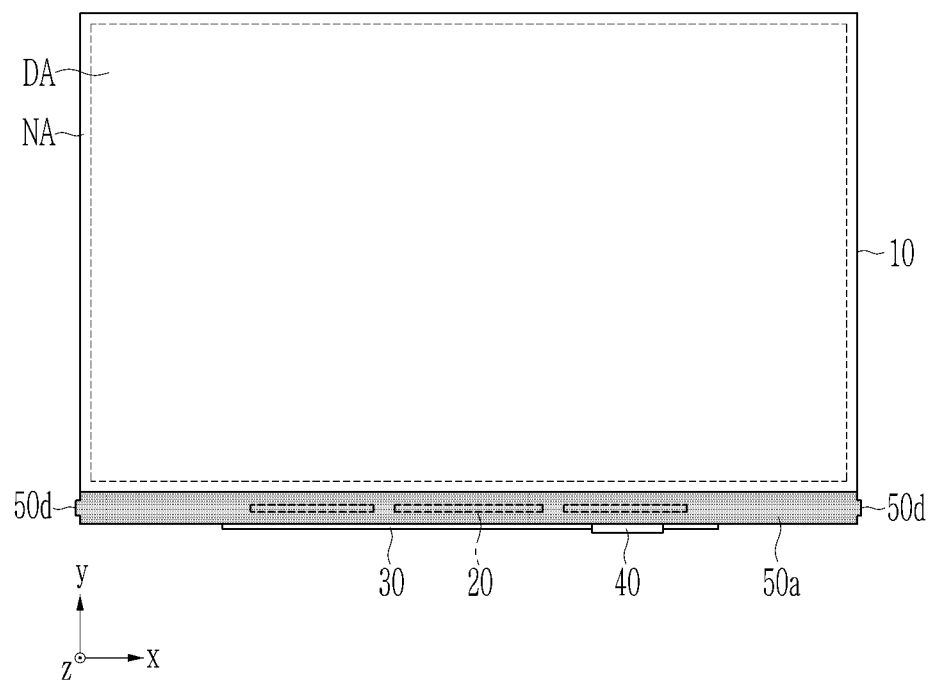
FIG. 9 illustrates a schematic front view showing a display device to which a cover is applied according to an embodiment.
Figure 10:
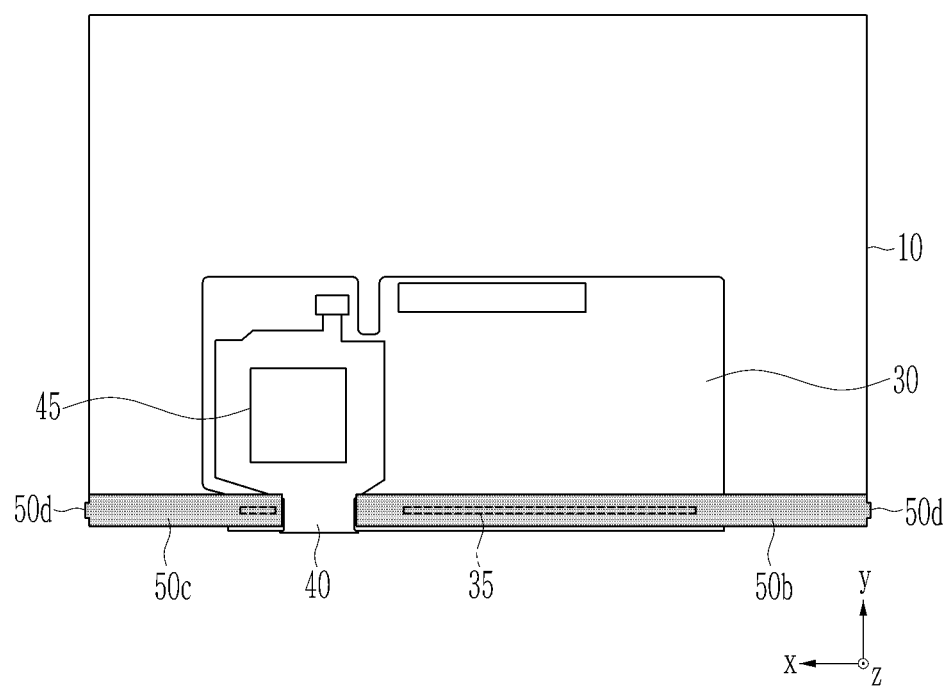
FIG. 10 illustrates a schematic rear view showing a display device to which a cover is applied according to an embodiment.

FIG. 8A and FIG. 8B each illustrate a schematic view showing a cover according to an embodiment, FIG. 9 illustrates a schematic front view showing a display device to which a cover is applied according to an embodiment, and FIG. 10 illustrates a schematic rear view showing a display device to which a cover is applied according to an embodiment.

Referring to FIG. 8A and FIG. 8B, in an embodiment, the cover 50 may include a first portion 50a, a second portion 50b, and a third portion 50c each having a first width w1, and a bending portion 50d having a second width w2 that is smaller than the first width w1. The bending portion 50d may be positioned between the first portion 50a and the second portion 50b and between the first portion 50a and the third portion 50c. The bending portion 50d may be concavely formed or recessed from opposite long sides of the cover 50 as illustrated in FIG. 8A, and may be concavely formed or recessed from one long side of the cover 50 as illustrated in 8B.

Referring to FIG. 9 and FIG. 10, in an embodiment, the cover 50 may be attached to the display panel 10 to cover the driving integrated circuit chip 20 from a front of the display panel 10. In such an embodiment, the first portion 50a of the cover 50 may be attached to a front surface of the display panel 10 while covering the driving integrated circuit chip 20, and the bending portion 50d may be bent while surrounding opposite edges or side surface of the display panel 10. The second portion 50b and the third portion 50c of the cover 50 may be attached to the rear surface of the display panel 10 and the first printed circuit board 30. As in the above-described embodiment, the bending portion 50d may protrude toward the side of the display panel 10 by approximately the thickness of the bending portion 50d, but since a width w2 of the bending portion 50d is narrow, a protruding area may be reduced.

Figure 11:
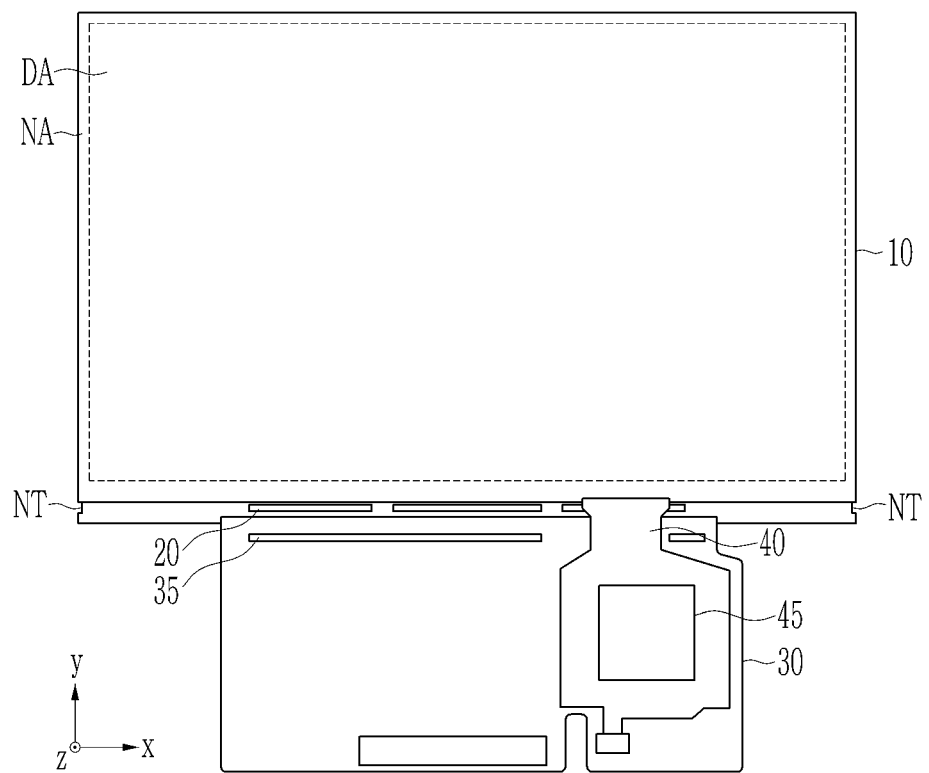
FIG. 11 illustrates a schematic front view showing a display device according to an embodiment.
Figure 12A:
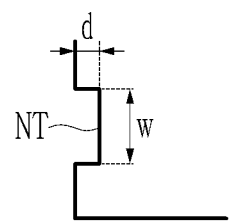
FIG. 12A, FIG. 12B, and FIG. 12C each illustrate a schematic view showing a shape of a notch according to an embodiment.
Figure 12B:
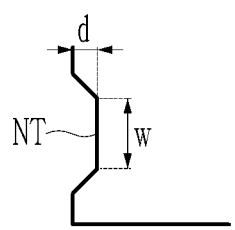
Figure 12C:
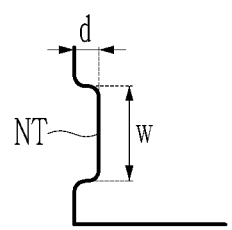

FIG. 11 illustrates a schematic front view showing a display device according to an embodiment, and FIG. 12A, FIG. 12B, and FIG. 12C each illustrate a schematic view showing a shape of a notch according to an embodiment.

Referring to FIG. 11, in an embodiment, notches NT may be formed in opposite edges (or side surfaces) of a lower end portion of the display panel 10. The notches NT at the opposite sides may be positioned to be aligned in the first direction x. In addition, the notches NT may be positioned to be aligned with the driving integrated circuit chip 20 in the first direction x. In an embodiment, for example, the notches NT may be positioned on a same line as the driving integrated circuit chip 20 in the first direction x. The notches NT may be formed only on one (i.e., left or right) edge of the opposite edges of the lower end portion of the display panel 10.

FIG. 12A, FIG. 12B, and FIG. 12C illustrate embodiments of the notch NT formed at a left edge of the display panel 10 in FIG. 11. The notch NT formed at the right edge in FIG. 11 may be symmetrical to that illustrated in FIG. 12A, FIG. 12B, or FIG. 12C. The notch NT may have a shape that may be formed by cutting an edge of the display panel 10 to a predetermined width w and a predetermined depth d. The depth d of the notch NT may be greater than a thickness of the bending portion 50d of the cover 50. In ani embodiment, for example, the depth d of the notch NT may be in a range of about 100 μm to about 300 μm. The width w of the notch NT may correspond to the width w2 of the bending portion 50d of the cover 50. The width w of the notch NT may be equal to or slightly greater than the width w2 of the bending portion 50d of the cover 50. The notch NT may be formed substantially parallel to the edge of the display panel 10 while being concave from the edge of the display panel 10. In an embodiment, for example, when viewed from the front, the notch NT may be approximately rectangular as illustrated in FIG. 12A, or approximately trapezoidal as illustrated in FIG. 12B. The notch NT may have a rounded corner as illustrated in FIG. 12C. In alternative embodiments, the notch NT may have various shapes, such as a semi-circular shape or a semi-elliptical shape.

Figure 13:
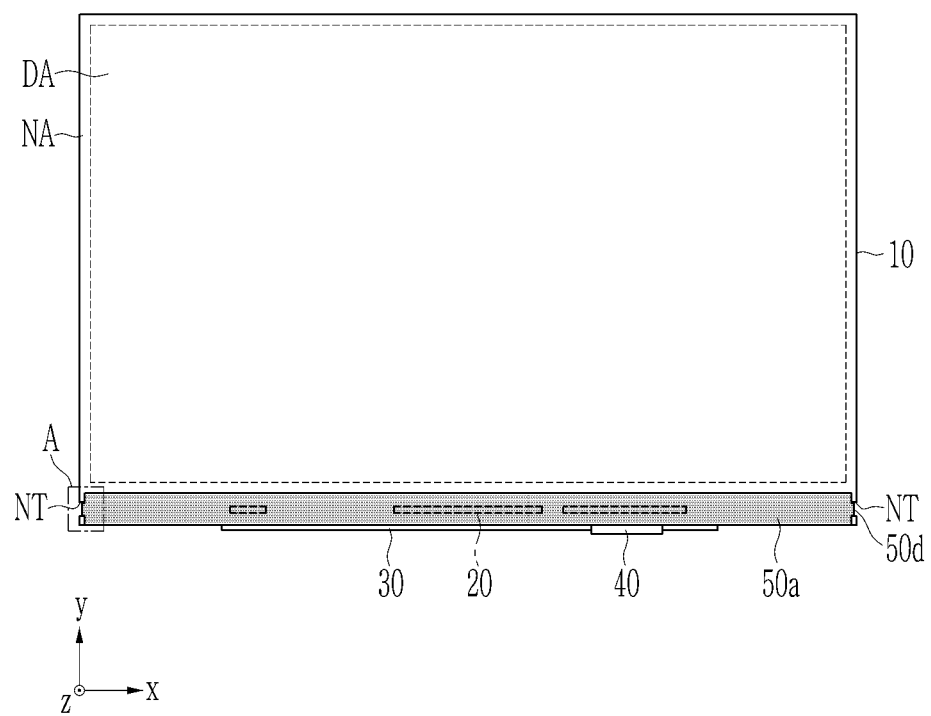
FIG. 13 illustrates a schematic front view showing a display device to which a cover is applied according to an embodiment.
Figure 14:
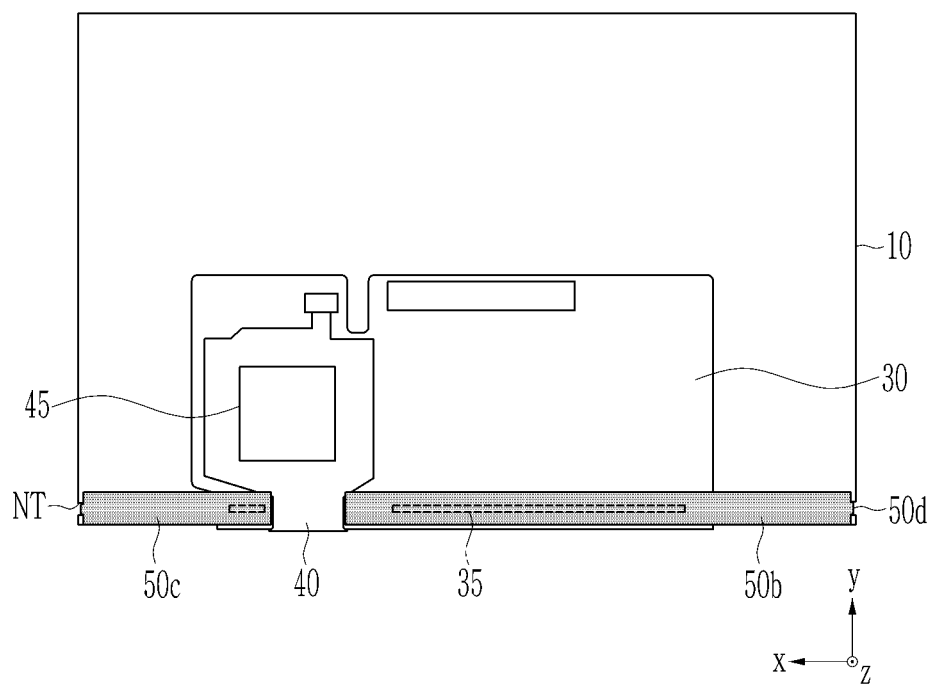
FIG. 14 illustrates a schematic rear view showing a display device to which a cover is applied according to an embodiment.
Figure 15:
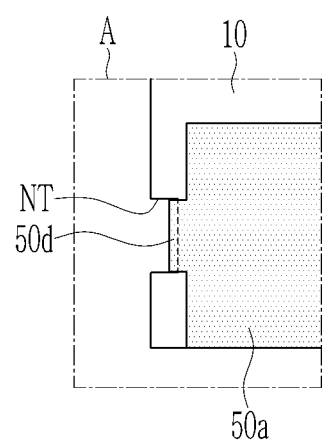
FIG. 15 illustrates an enlarged view of a region A in FIG. 13.

FIG. 13 illustrates a schematic front view showing a display device to which a cover is applied according to an embodiment, FIG. 14 illustrates a schematic rear view showing a display device to which a cover is applied according to an embodiment, and FIG. 15 illustrates an enlarged view of a region A in FIG. 13.

Referring to FIG. 13, FIG. 14, and FIG. 15, an embodiment in which the cover 50 illustrated in FIG. 8B is applied to the display panel 10 illustrated in FIG. 11 is illustrated. In such an embodiment, as in the above-described embodiments, the cover 50 may be attached to the display panel 10 to cover the driving integrated circuit chip 20 from a front of the display panel 10. The first portion 50a may be attached to the front surface of the display panel 10 while covering the driving integrated circuit chip 20, the bending portion 50d may be bent while surrounding the opposite edges of the display panel 10, and the second portion 50b and the third portion 50c may be attached to the rear surface of the display panel 10 and the first printed circuit board 30. In an embodiment, the bending portion 50d may be accommodated in the notch NT at the opposite edges of the display panel 10. The bending portion 50d of the cover 50 is accommodated in the notch NT and does not protrude from the opposite edges of the display panel 10, and thus the bending portion 50d of the cover 50 may be effectively prevented from being in contact with other components or objects, thereby preventing the bending portion 50d from being damaged by friction or the like.

Figure 16:
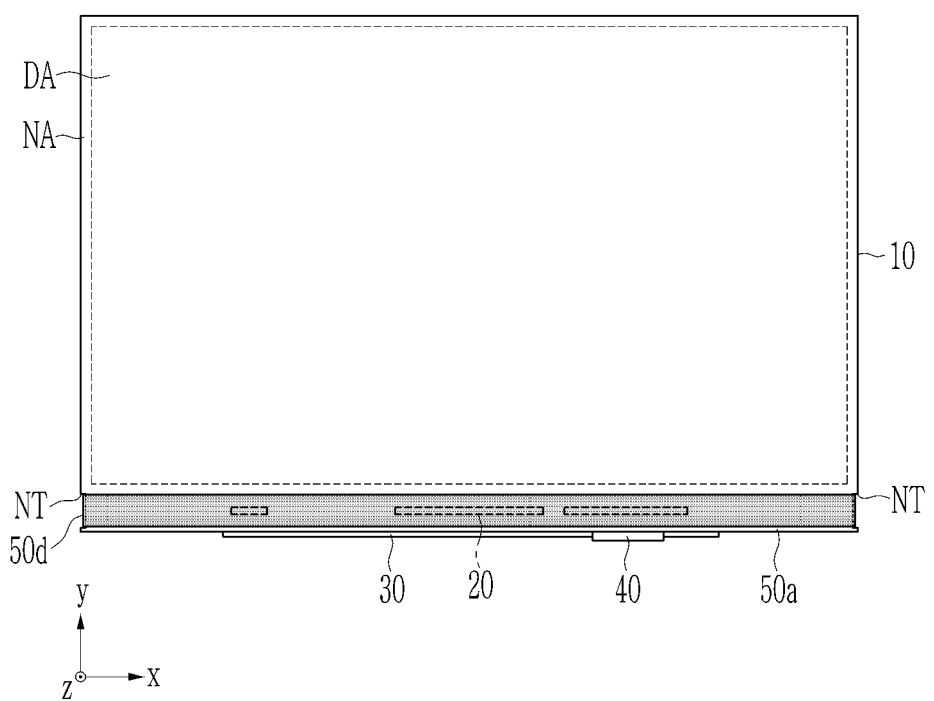
FIG. 16 illustrates a schematic front view showing a display device to which a cover is applied according to an embodiment.

FIG. 16 illustrates a schematic front view showing a display device to which a cover is applied according to an embodiment.

Referring to FIG. 16, an embodiment in which the cover 50 illustrated in FIG. 3 is applied to the display panel 10 according to an embodiment is illustrated. The first portion 50a of the cover 50 may be attached to a front surface of the display panel 10 while covering the driving integrated circuit chip 20, and the bending portion 50d may be bent while surrounding opposite edges of the display panel 10. The bending portion 50d may be accommodated in the notches NT formed at the opposite edges of the display panel 10. As the width w1 of the bending portion 50d increases, the width of the notch NT may increase, but a possibility that the bending portion 50d may be damaged may be reduced. In a case where the width of the bending portion 50d is too narrow, the cover 50 may be broken or torn at the bending portion 50d in a process of attaching the cover 50. In an embodiment where the width of the cover 50 is uniform or constant as a whole, the cover 50 may be effectively prevented from being broken or torn at the bending portion 50d in the process of attaching the cover 50 to the display panel 10.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel;
   a driving integrated circuit chip disposed on a front surface of the display panel; and
   a cover disposed to cover the driving integrated circuit chip,
   wherein the cover includes a first portion covering the driving integrated circuit chip, a second portion disposed on a rear surface of the display panel, and a bending portion disposed between the first portion and the second portion and surrounding an edge of the display panel,
   wherein a notch is defined at the edge of the display panel, and
   wherein the bending portion is disposed in the notch.

2. The display device of claim 1, wherein
   the notch is defined at opposite edges of the display panel, and the cover further includes a third portion disposed on the rear surface of the display panel, and a bending portion disposed between the first portion and the third portion and in the notch.

3. The display device of claim 2, wherein
each of the first portion, the second portion, and the third portion has a first width, and
the bending portion has a second width which is smaller than the first width.

4. The display device of claim 2, wherein
the first portion, the second portion, the third portion, and the bending portion have a same width as each other.

5. The display device of claim 1, wherein
the notch is defined at opposite edges of the display panel in a first direction, and
the notch and the driving integrated circuit chip are aligned in the first direction.

6. The display device of claim 5, further comprising
a printed circuit board bonded to a lower end portion of the display panel, wherein the printed circuit board is bent while surrounding an edge of the lower end portion of the display panel.

7. The display device of claim 6, wherein
the second portion is electrically connected to the printed circuit board.

8. The display device of claim 6, wherein
a bent portion of the printed circuit board protrudes from a lower end of the display panel in a second direction crossing the first direction, and
the cover does not protrude from a side end of the display panel in the second direction.

9. An electronic device comprising: a display panel including a first edge extending in a first direction and a second edge extending in a second direction intersecting the first direction; a driving integrated circuit chip disposed on a front surface of the display panel; a printed circuit board connected to the front surface of the display panel and bent toward a rear surface of the display panel while surrounding the first edge; and a cover disposed to cover the driving integrated circuit chip on the front surface of the display panel and to be bent while surrounding the second edge to be connected to the printed circuit board on the rear surface of the display panel, wherein the cover includes a first portion covering the driving integrated circuit chip, a second portion disposed on the rear surface of the display panel, a third portion disposed on the rear surface of the display panel and a bending portion disposed between the first portion and the second portion and between the first portion and the third portion and surrounding the second edge of the display panel, wherein the second portion and the third portion are connected to the printed circuit board, and wherein a notch is defined at the second edge of the display panel, and the bending portion is disposed in the notch.

10. The electronic display device of claim 9, wherein the first portion is disposed on the front surface of the display panel, and the second portion and the third portion are disposed on the rear surface of the display panel.

11. The electronic display device of claim 9, wherein each of the first portion, the second portion, and the third portion has a first width, and the bending portion has a second width which is smaller than the first width.

12. The electronic display device of claim 9, wherein the first portion, the second portion, the third portion, and the bending portion have a same width as each other.

13. The electronic display device of claim 9, wherein the second portion or the third portion is grounded to a ground portion disposed on the printed circuit board.

14. The electronic device of claim 9, wherein
the cover is in the form of a tape including a metal fabric, a metal mesh, or a metal foil.

15. The electronic device of claim 9, wherein the printed circuit board protrudes from the first edge in the second direction.

16. The electronic device of claim 15, wherein
the cover does not protrude from the first edge in the second direction.

* * * * *